United States Patent
Kim et al.

(10) Patent No.: US 9,035,345 B2
(45) Date of Patent: May 19, 2015

(54) LIGHT EMITTING DEVICE PACKAGE FOR CONTROLLING LIGHT EMISSION FROM A SIDE SURFACE AND METHOD OF MANUFACTURING THE SAME

(71) Applicant: SAMSUNG ELECTRONICS CO., LTD., Suwon-si, Gyeonggi-do (KR)

(72) Inventors: Jung Hoon Kim, Gyeonggi-do (KR); Il Woo Park, Gyeonggi-do (KR)

(73) Assignee: SAMSUNG ELECTRONICS CO., LTD., Suwon, Gyeonggi-Do (KR)

( * ) Notice: Subject to any disclaimer, the term of this patent is extended or adjusted under 35 U.S.C. 154(b) by 0 days.

(21) Appl. No.: 13/955,786

(22) Filed: Jul. 31, 2013

(65) Prior Publication Data
US 2014/0070238 A1    Mar. 13, 2014

(30) Foreign Application Priority Data
Sep. 12, 2012    (KR) .................. 10-2012-0100874

(51) Int. Cl.
H01L 33/00    (2010.01)
H01L 33/60    (2010.01)
H01L 33/50    (2010.01)
H01L 33/48    (2010.01)
H01L 33/46    (2010.01)

(52) U.S. Cl.
CPC ............... *H01L 33/60* (2013.01); *H01L 33/50* (2013.01); *H01L 33/483* (2013.01); *H01L 33/505* (2013.01); *H01L 33/46* (2013.01)

(58) Field of Classification Search
CPC ........ H01L 33/483; H01L 33/46; H01L 33/50
USPC ........................................................... 257/99
See application file for complete search history.

(56) References Cited

U.S. PATENT DOCUMENTS

| | | | |
|---|---|---|---|
| 2004/0119086 A1 | 6/2004 | Yano et al. |
| 2009/0179207 A1 | 7/2009 | Chitnis et al. |
| 2012/0235199 A1 | 9/2012 | Andrews et al. |
| 2012/0248481 A1 | 10/2012 | Seo |

FOREIGN PATENT DOCUMENTS

| | | |
|---|---|---|
| JP | 2004-193581 A | 7/2004 |
| KR | 10-2007-0090071 A | 9/2007 |
| KR | 10-1039424 B1 | 6/2011 |
| KR | 10-2012-0039587 A | 4/2012 |

*Primary Examiner* — Douglas Menz
(74) *Attorney, Agent, or Firm* — McDermott Will & Emery LLP

(57) ABSTRACT

A light emitting device package includes a base including at least one recess, at least one light emitting device disposed within the recess, and a reflective wall filling a space between the light emitting device and the recess so as to surround lateral surfaces of the light emitting device. The recess is formed to have a depth ranging from 80% to 120% of a height of the light emitting device.

15 Claims, 5 Drawing Sheets

LIGHT EMITTING DEVICE PACKAGE FOR CONTROLLING LIGHT EMISSION FROM A SIDE SURFACE AND METHOD OF MANUFACTURING THE SAME

CROSS-REFERENCE TO RELATED APPLICATION

This application claims priority from Korean Patent Application No. 10-2012-0100874, filed on Sep. 12, 2012 in the Korean Intellectual Property Office, the disclosure of which is incorporated herein by reference in its entirety.

TECHNICAL FIELD

Aspects of exemplary embodiments relate to a light emitting device package for controlling light emission from a side surface, and a method of manufacturing the same.

BACKGROUND

Illumination LED products are being developed to provide improved luminance efficiency, reliability, color quality, and production cost competitiveness. As development has turned toward producing high output products, demand for devices having high luminance efficiency, high reliability, and low cost has been on the rise. To meet these requirements, flip chip type LEDs have been developed that have excellent heat dissipation characteristics and a simple structure and manufacturing process. Such flip chip type LEDS facilitate assembly of large size devices, and package products using LEDs have been released onto the market.

However, a flip chip type LED emits light from the side thereof as well as from an upper surface. Thus, in order to incorporate a flip chip type LED into an illumination product, a technique of controlling both a lateral phosphor layer and an upper phosphor layer is needed. In response to increased demand for illumination products supporting color quality within a MacAdam ellipse level 3 step, techniques for controlling laterally generated light are urgently needed.

SUMMARY

An aspect of an exemplary embodiment provides a light emitting device package in which light generated from the side of a light emitting device is easily controlled, and a method of manufacturing the same.

According to an aspect of an exemplary embodiment, there is provided a light emitting device package including: a base including at least one recess; at least one light emitting device disposed within the recess; and a reflective wall filling a space between the light emitting device and the recess so as to surround lateral surfaces of the light emitting device, wherein the recess is formed to have a depth ranging from 80% to 120% of a height of the light emitting device.

The light emitting device package may further include a wavelength conversion layer disposed on the light emitting device.

The wavelength conversion layer may be larger than the light emitting device and may extend laterally outwards from edges of the light emitting device.

The wavelength conversion layer may be disposed such that an upper surface of the wavelength conversion layer does not contact the reflective wall.

The base may include a metal plate having conductivity.

The light emitting device package may further include a reflective layer covering a surface of the recess and formed by depressing an upper surface of the metal plate.

The metal plate may include a first plate, a second plate, and an insulating layer interposed between the first plate and the second plate, a portion of an upper surface of the first plate may be exposed to the recess, and the recess may penetrate through the second plate and the insulating layer.

The reflective wall may include a filler and white molding compounds.

The light emitting device package may further include a lens installed on the base and covering the light emitting device.

According to another aspect of en exemplary embodiment, there is provided a method of manufacturing a light emitting device package, including: installing a light emitting device within a recess of a base including the recess; forming a wavelength conversion layer on the light emitting device; and forming a reflective wall in a space between the light emitting device and the recess such that the reflective wall surrounds lateral surfaces of the light emitting device, wherein the recess is formed to have a depth ranging from 80% to 120% of a height of the light emitting device.

The base may include a metal place, and the method may include forming the recess to be depressed in an upper surface of the metal plate.

The method may further include: forming a metal plate including a first metal plate, a second metal plate and an insulating layer interposed between the first and second metal plates to serve as the base; and forming the recess in the base by forming the recess to penetrate the insulating layer and the second plate such that a portion of the first plate is exposed.

The forming of the reflective wall may include: injecting white molding compounds, including a filler dispersed in the white molding compounds, into a space between the light emitting device and the recess and hardening the white molding compounds.

According to another aspect of en exemplary embodiment, there is provided a light emitting device package including: a base having a notch formed in an upper surface, wherein the notch surrounds a closed region of the upper surface; at least one light emitting device disposed on the upper surface of the base so as to be surrounded by the notch; and a reflective wall disposed on the upper surface of the base only within the closed region surrounded by the notch and surrounding a lateral circumference of the light emitting device.

The reflective wall may cover the side surfaces of the light emitting device to prevent light leakage from side surfaces of the light emitting device.

The light emitting device package may further include a wavelength conversion layer disposed on a top surface of the light emitting device. The wavelength conversion layer may be larger than the light emitting device and extend laterally outwards from edges of the light emitting device. The reflective wall may cover side surfaces of the wavelength conversion layer.

The base may include a reflective layer formed in an upper surface thereof, the at least one light emitting device may be disposed on the reflective layer, and the notch may be formed in the reflective layer.

The base may include a pair of metal conductors and an insulating member insulating the metal conductors from each other.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Figure 1:
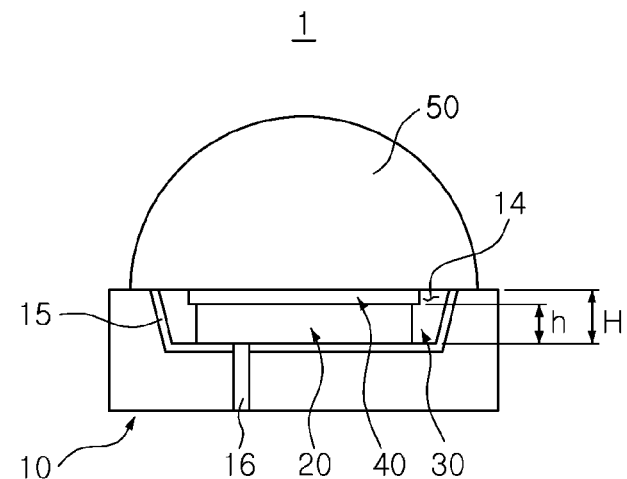
FIG. 1 is a cross-sectional view schematically illustrating a light emitting device package according to an exemplary embodiment.

Exemplary embodiments will now be described in detail with reference to the accompanying drawings. Exemplary embodiments may, however, take many different forms and should not be construed as being limited to the particular embodiments set forth herein. Rather, these exemplary embodiments are provided so that this disclosure will be thorough and complete, and will fully convey the scope of the present inventive concepts to those skilled in the art. In the drawings, the shapes and dimensions of elements may be exaggerated for clarity, and the same reference numerals will be used throughout to designate the same or like components.

Figure 2:
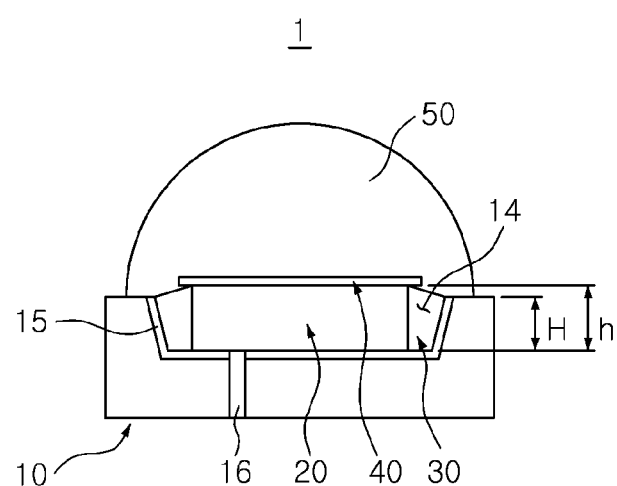
FIG. 2 is a cross-sectional view schematically illustrating a modification of the light emitting device package of FIG. 1.

Light emitting device packages according to an embodiment of the present disclosure are illustrated in FIGS. 1 and 2. FIG. 1 is a cross-sectional view schematically illustrating a light emitting device package according to an exemplary embodiment, and FIG. 2 is a cross-sectional view schematically illustrating a modification of the light emitting device package of FIG. 1.

Referring to FIGS. 1 and 2, a light emitting device package 1 according to an exemplary embodiment includes a base 10, a light emitting device 20 mounted on the base 10, and a reflective wall 30 surrounding a lateral portion of the light emitting device 20. The light emitting device package may further include a wavelength conversion layer 40 disposed on a top surface of the light emitting device 20, and/or a lens 50 disposed above the top surface of the light emitting device 20 so as to cover the light emitting device 20.

At least one light emitting device 20 may be mounted on the base 10 as described hereinafter. The light emitting device 20 is a type of semiconductor device that generates light having a predetermined wavelength upon receiving power applied thereto from the outside, such as a light emitting diode (LED). The light emitting device 20 may emit blue light, green light, or red light according to a material contained therein, and may also emit white light.

As illustrated in FIG. 1, the light emitting device 20 may have a flip chip type structure in which electrodes are provided in the same direction. For example, the light emitting device 20 may have electrodes formed on a bottom surface thereof that faces the base 10, and the electrodes may be electrically connected to pads formed in the base 10. The light emitting device 20 may be mounted and electrically connected within a recess 14 of the base 10 through solder bumps, or the like.

In the present embodiment, a single light emitting device 20 is provided in base 10 (and in recess 14), but the present disclosure is not limited thereto. For example, a plurality of light emitting devices 20 may be provided in base 10 (and/or in recess 14). The light emitting devices 20 may be of the same type of light emitting devices, and may generate light having the same wavelength. Alternatively, the light emitting devices 20 may be of various types of light emitting devices, and may generate light beams having different wavelengths.

The wavelength conversion layer 40 may be disposed on a top surface of the light emitting device 20. The wavelength conversion layer 40 may be configured as a film or a plate. The wavelength conversion layer 40 may be of a size larger than the light emitting device 20, so as to have an overhang structure extending laterally outwards from outer edges of the top surface of the light emitting device 20.

The wavelength conversion layer 40 may serve to convert wavelength(s) of light emitted from the light emitting device 20. To this end, the wavelength conversion layer 40 may have a structure in which at least one type of phosphor is dispersed within a transparent resin material. Light emitted from the light emitting device 20 may be converted by the wavelength conversion layer 40 to provide white light. For example, when the light emitting device 20 emits blue light, yellow phosphors may be used, and when the light emitting device 20 emits ultraviolet light, red, green, and blue phosphors may be mixed to be used. In order to emit white light, various phosphor colors may be selected depending on the color of light emitted by the light emitting device 20. Also, the wavelength conversion material may be selected to emit light of another color (not necessarily white). For example, a wavelength conversion material that is green, red, or the like, may be coated to implement a light source emitting a corresponding color.

The wavelength conversion layer 40 may have its wavelength conversion characteristics adjusted to minimize color dispersion, in consideration of light emission characteristics of the corresponding light emitting device 20. The wavelength characteristics of the wavelength conversion layer 40 may be adjusted by including different types of phosphors in the wavelength conversion layer 40, or by changing the content of phosphors in the wavelength conversion layer 40, and the like.

The appropriate wavelength conversion layer 40 may be selectively used according to the characteristics of the light emitting device 20, thereby adjusting color dispersion to the MacAdam ellipse level 3 step.

The base 10 may include at least one recess 14 having a reflective cup structure. The base 10 is a type of frame member supporting the light emitting device 20 mounted thereon and may serve as a package main body.

The base 10 may be made of a metal having electrical conductivity and may include, for example, a metal plate. The metal plate may be configured as at least one pair metal conductors connected to different polarities, and the pair of metal conductors may be connected through an insulating member 16 and insulated from each other thereby. In this case, the pair of metal conductors may also serve as a lead frame.

The recess 14 may be formed as a depression in an upper surface of the base 10, and may be formed to a predetermined depth from the upper surface of the base 10. The recess 14 may be formed by performing press working or etching on the upper surface of the base 10, or may be formed through various other methods.

A reflective layer 15 may be formed to cover the surface of the recess 14. The reflective layer 15 may be made of a metal having high reflectivity and may be formed through a method such as coating, deposition, adhesion, or the like. The reflective layer 15 may have a structure covering the surface of the recess 14. In the present embodiment, it is illustrated that the reflective layer 15 is only formed on the surface of the recess 14, but the present disclosure is not limited thereto. For example, the reflective layer 15 may be formed to have a structure covering at least portions of the upper surface of the base 10 including the recess 14.

The recess 14 may be formed to have a depth H within a range of 80% (i.e., −20%) to 120% (i.e., +20%) of the height h of the light emitting device 20.

As illustrated in FIG. 1, the recess 14 may have a depth that is equal to the height of the light emitting device 20, or have a depth H that is deeper than the height of the light emitting device 20. In this case, the recess 14 may be formed as deep as up to 120% (i.e., +20%) of a height h of the light emitting device 20. For example, when the height h of the light emitting device 20 is 140 µm, the recess 14 may have a depth H up to 168 µm corresponding to 120% (i.e., +20%) of the 140 µm height.

If the recess 14 is formed to have a depth H greater than 120%, e.g., higher than 169 µm, the light emitting device including the wavelength conversion layer 40 will be disposed to be buried within the recess 14. As a result, a problem may arise in that an angle of beam spread of light emitted by the light emitting device 20 to the outside will be limited by edges of the recess 14 protruding by more than 20% past the upper surface of the light emitting device 20, and in that overall luminance will be degraded.

Table 1 below shows changes in luminance according to changes in depth of the recess. As shown in Table 1, it can be seen that luminance is degraded (−4.1%) when the depth H of the recess 14 is more than 120% of the height of the light emitting device 20.

Meanwhile, as illustrated in FIG. 2, the recess 14 may have a depth H equal to or lower than a height of the light emitting device 20. In this case, the recess 14 may be formed to have a depth of 80% (i.e., −20%) of the height h of the light emitting device 20. For example, when the height h of the light emitting device 20 is 140 µm, the recess 14 may have a depth H of 112 µm corresponding to 80% of 140 µm.

When the recess 14 is formed to have a depth H of 80% of the height h of the light emitting device 20, i.e., a depth of 111 µm, the light emitting device 20 protrudes upwardly from the upper surface of the base 10. As a result, the light emitting device 20 potentially generates a lateral light leakage phenomenon due to the portion of the light emitting device 20 protruding upwardly from the base 10. Namely, light emitted from the protruding portion of the light emitting device 20, among light emitted from the lateral surface of the light emitting device 20, is directly emitted to the outside, rather than being reflected by the recess 14 or passing through the wavelength conversion layer 40. As such, a problem of color dispersion may increase.

However, in the case that the depth H of the recess 14 is 80% of the height h of the light emitting device 20, the lateral surface of the protruding light emitting device 20 may be surrounded by the reflective wall 30 as described hereinafter to control light emitted from the protruding lateral surface of the light emitting device 20. Namely, when the depth H of the recess 14 is 112 µm, the light emitting device 20 protrudes upwardly past an upper surface of the base 10 by a height corresponding to 28 µm, and a lateral surface of the protruding light emitting device 20 may be surrounded by the reflective wall 30, thus preventing light leakage.

However, if the recess 14 is formed to a depth equal to or less than 111 µm, the height of the light emitting device protruding upwardly from the base 10 is increased, and thus, portions of the lateral surface of the protruding light emitting device 20 may not be surrounded by the reflective wall 30. Namely, there may be a limitation in the height of the reflective wall 30 in its formation to surround the lateral surface of the protruding light emitting device 20, and a maximum height of the recess 14 may be set to up to 80% of the height h of the light emitting device 20 (as described in more detail below). Thus, if the depth H of the recess 14 is less than 80%, light leakage may occur because portions of the lateral surface of the protruding light emitting device 20 are not covered by the reflective wall 30.

Table 2 below shows changes in luminance and MacAdam steps according to changes in height of the recess.

TABLE 1

| Height | Vf | lm | Lm variation rate | | CIE X | CIE Y | CRI | CCT |
|---|---|---|---|---|---|---|---|---|
| 100% | 3.01 | 101.1 | 100.0% | There is no | 0.4683 | 0.4111 | 81.7 | 2599.2 |
| 120% | 3.01 | 100.7 | 99.6% | significant difference | 0.4674 | 0.4103 | 81.8 | 2607.5 |
| 130% | 3.02 | 97 | 95.9% | −4.1% | 0.4708 | 0.4116 | 81.7 | 2562.3 |

TABLE 2

| Classification | Vf (V) | IV (lm) | X | Y | CRI | CCT (K) | MacAdam step |
|---|---|---|---|---|---|---|---|
| Structure without reflective wall | 3.07 | 95.3 | 0.2750 | 0.2204 | 61.5 | 22360 | 3 step |
| Height of recess ±0% | 3.06 | 131.5 | 0.3410 | 0.3455 | 69.7 | 5140 | 2.5 step |
| Height of recess <−20% | 3.03 | 125.3 | 0.3352 | 0.3342 | 70.0 | 5330 | 5 step |

When the depth H of the recess is less than 80% of the height h of the light emitting device 20, the reflective wall 30 may not be properly formed. Thus, as can be seen in Table 2, luminance is degraded about 4.7% due to lateral light leakage. Also, a MacAdam step is increased, indicating a degradation in color quality in comparison to the structure without the reflective wall 30.

The reflective wall 30 may be formed by filling a space between the light emitting device 20 and the recess 14 to surround the lateral surface of the light emitting device 20. The reflective wall 30 may be made of a filler and white molding compounds having high light reflectivity. The reflective wall 30 may reflect light emitted from the lateral surface of the light emitting device 20 to allow the light to be emitted to the outside.

The filler may include one or more materials selected from the group consisting of $SiO_2$, $TiO_2$, and $Al_2O_3$. The filler may be contained in the white molding compounds as nano-scale particles.

The white molding compounds may include a thermosetting resin having high heat resistance or a silicon resin. Also, the white molding compounds may include white pigment and a thermoplastic resin containing a filler, a hardening agent, a parting agent (or a mold release agent), an antioxidant, an adhesive strength improver, and the like, added thereto.

The reflective wall 30 may have a structure surrounding the light emitting device 20 along the circumference of the lateral surface(s) of the light emitting device 20. In some examples, at least a portion of the light emitting device 20 may not be covered by the reflective wall 30 so that light generated from the light emitting device 20 may be irradiated to the outside. In detail, since the wavelength conversion layer 40 is provided on an upper surface of the light emitting device 20 to convert the wavelength of the emitted light, the reflective wall 30 may be configured to cover the lateral surface(s) of the light emitting device 20 and/or cover a portion of a lateral surface of the wavelength conversion layer 40. Thus, an upper surface of the wavelength conversion layer 40 or both the upper surface and the lateral surface of the wavelength conversion layer 40 may be exposed outwardly.

The reflective wall 30 may be formed by injecting white molding compounds containing a filler into a space between the light emitting device 20 and the recess 14 through a dispenser D, or the like. When the depth H of the recess 14 is higher than the light emitting device 20, a smaller quantity of the white molding compounds may be injected to allow the upper surface of the wavelength conversion layer 40 to be exposed, rather than being covered. When the depth H of the recess 14 is lower than the light emitting device 20, a larger quantity of the white molding compounds may be injected so as to be spread along the lateral surface of the protruding light emitting device 20 so as to surround the portion of the lateral surface extending upwards above the recess 14. In this case, however, there may be a limitation in a maximum height to which the white molding compounds can be formed while maintaining a shape thereof on the lateral surface of the light emitting device due to surface tension, so the recess 14 should not be excessively deep (e.g., in the present embodiment, a maximum depth of the recess 14 may be 80% of the height (h) of the light emitting device 20).

The lens 50 may be configured to be mounted on the base 10 to cover the light emitting device 20. The lens 50 may be made of a transparent resin material allowing light output from the light emitting device 20 to be smoothly emitted to the outside.

As illustrated, the lens 50 may be formed as a convex lens protruding outwards from the base 10. Accordingly, light passing through the lens 50 may be irradiated in a broad range. In the present embodiment, the lens 50 is configured as a convex lens, but the present disclosure is not limited thereto and lenses having various other shapes may be employed.

The lens 50 may be directly formed on the base 10 through a molding method such as compression molding, transfer molding, or the like, or a potting method using a dispenser, or may be fabricated through a separate process and attached to the base 10 through an adhesive, or the like.

The lens 50 may be attached such that edge portions thereof are placed on the base 10 made of a metal and, in this case, since the resin material and the metal form an interface, delamination is unlikely to be generated, thereby enhancing reliability.

Figure 3A:
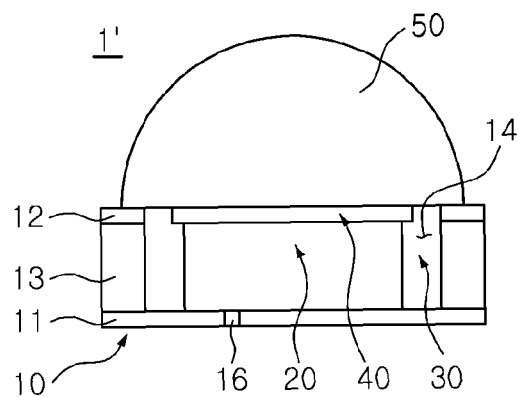
FIGS. 3A and 3B are cross-sectional views schematically illustrating light emitting device packages according to other exemplary embodiments.
Figure 3B:
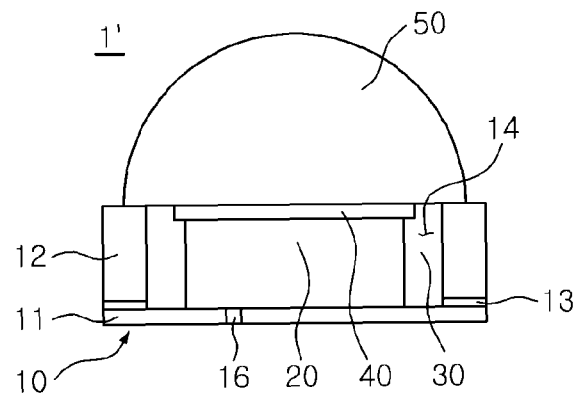

FIGS. 3A and 3B illustrate light emitting device packages according to exemplary embodiments. FIGS. 3A and 3B are cross-sectional views schematically illustrating the light emitting device packages.

The basic structure of the light emitting device packages according to exemplary embodiments illustrated in FIGS. 3A and 3B is substantially the same as that of the light emitting device package according to embodiments illustrated in FIGS. 1 and 2, except for a structure of a base. Thus, a description of the same parts as those of the former embodiment will be omitted and a configuration of the base will be largely described.

As illustrated in FIG. 3A, in a light emitting device package 1' according to an exemplary embodiment, the base 10 includes a metal plate having conductivity. The metal plate may include a first plate 11, a second plate 12, and an insulating layer 13 interposed between the first plate 11 and the second plate 12.

The first plate 11 and the second plate 12 may be made of the same metal or of different metals, and may be configured as thin films corresponding to each other. The first and second plates 11 and 12 may be provided to face opposite sides of the insulating layer 13, such that the insulating layer 13 is interposed between the first and second plates 11 and 12. The insulating layer 13 may include a polyimide (PI) layer.

The recess 14 in which the light emitting device 20 is disposed or mounted may be configured to penetrate the second plate 12 and the insulating layer 13. A portion of the first plate 11 may be exposed to the recess 14. Thus, the first plate 11 can form the bottom surface of the recess 14, and the penetrated portions of the insulating layer 13 and the second plate 12 can form lateral surfaces of the recess 14.

FIG. 3B schematically illustrates another exemplary embodiment of the base 10. The first plate 11 and the second plate 12 may be made of the same metal or different metals, and the relatively thick second plate 12 is attached to the first plate 11. In this case, the insulating layer 13 interposed between the first and second plates 11 and 12 may be an adhesive layer.

The recess 14 may be configured to penetrate the second plate 12 and the insulating layer 13 and, in this case, the thickness of the insulating layer 13 may be substantially negligible relative to the thickness of the second plate 12, so the recess 14 may be considered to penetrate the second plate 12.

The base 10 has a structure in which the first plate 11, the insulating layer 13, and the second plate 12 are laminated. The base 10 may have a thickness ranging from 50 μm to 200 μm. Accordingly, a flexible thin film type package structure may be implemented. Thus, the light emitting device package is lightweight, small, and flexible, obtaining an effect of increasing degree of freedom in design when installed in an illumination apparatus, or the like.

Figure 4:
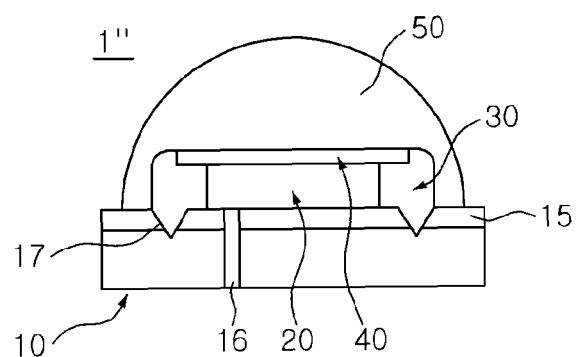
FIG. 4 is a cross-sectional view schematically illustrating a light emitting device package according to another exemplary embodiment.

FIG. 4 illustrates a light emitting device package according to another exemplary embodiment. FIG. 4 is a cross-sectional view schematically illustrating a light emitting device package according to an exemplary embodiment.

The basic structure of the light emitting device package according to an exemplary embodiment illustrated in FIG. 4 is substantially the same as that of the light emitting device package according to an exemplary embodiment illustrated in FIGS. 1, 2, 3A, and 3B, except for a structure of a base. Thus, a description of the same parts as those of the former embodiments will be omitted and a configuration of the base will be largely described.

As illustrated in FIG. 4, in a light emitting device package 1" according to an exemplary embodiment, the base 10 includes a metal plate having conductivity and may include a notch 17 formed thereon, instead of the recess 14.

On an upper surface of the base 10 on which the light emitting device 20 is mounted, the notch 17 may be spaced away from the light emitting device 20 and may surround the light emitting device 20 on all sides of the light emitting device 20. The notch 17 may be formed through press working, laser machining, etching, or the like.

The base 10 may further include a reflective layer 15 formed thereon. The reflective layer 15 may be made of a metal having high reflectivity and may be formed on an upper surface of the base 10 through coating, deposition, adhesion, or the like.

The notch 17 may be configured to be recessed with a predetermined depth from an upper surface of the base 10, and may penetrate through the reflective layer 15 disposed on the upper surface of the base 10. The structure shown in FIG. 4 corresponds to a case in which the reflective layer 15 is formed as a thin film, such that the reflective layer 15 has a thickness that is sufficiently thin for the notch 17 to be formed through the reflective layer 15 so as to penetrate into the upper surface of the base 10. However, the notch 17 may more generally be formed in only the reflective layer 15, such that the notch 17 does not necessarily penetrate into the upper surface of the base 10.

The reflective wall 30 may have a structure surrounding the lateral circumference of the light emitting device 20. The reflective wall 30 may be based on the notch 17 on the base 10, and the notch 17 may serve as a boundary of the reflective wall 30. In detail, the reflective wall 30 may be formed on the base 10 in only a region located within the notch 17 so as to be limited by the notch 17. The reflective wall 30 may be formed on a side surface of the light emitting device 20 by using surface tension, rather than being widely spread on the upper surface of the base 10.

FIGS. 5A through 5F are cross-sectional views schematically illustrating a method of manufacturing a light emitting device package according to an exemplary embodiment.

Figure 5A:
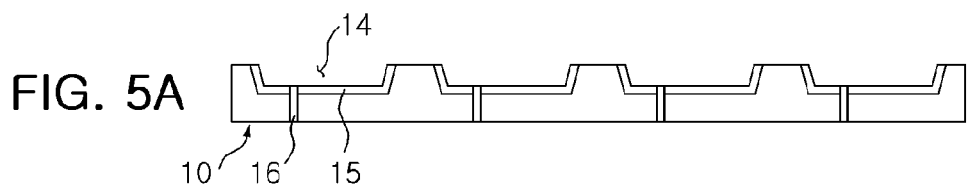
FIGS. 5A through 5F are cross-sectional views schematically illustrating a sequential process of manufacturing a light emitting device package according to an exemplary embodiment.

First, as illustrated in FIG. 5A, the base 10 with at least one recess 14 formed thereon is prepared. The recesses 14 may be arranged in a matrix form on the base 10.

The base may include a metal plate having electrical conductivity. A pair of metal conductors may be formed to be connected to the different polarities and may be physically connected to and insulated from each other through the insulating member 16. In this case, the pair of metal conductors may also serve as lead frames.

The recess 14 may be formed to be depressed by a certain depth from an upper surface of the base 10. The recess 14 may be formed by performing press working or etching the upper surface of the base 10 and may be formed through various other known methods.

The reflective layer 15 may be formed to cover the surface of the recess 14. The reflective layer 15 may be made of a metal having high reflectivity, and may be formed through a method such as coating, deposition, adhesion, or the like, and have a structure covering the surface of the recess 14. The recess 14 may be formed to have a depth H within a range of 80% (i.e., −20%) to 120% (i.e., +20%) of the height h of the light emitting device 20.

Figure 5B:
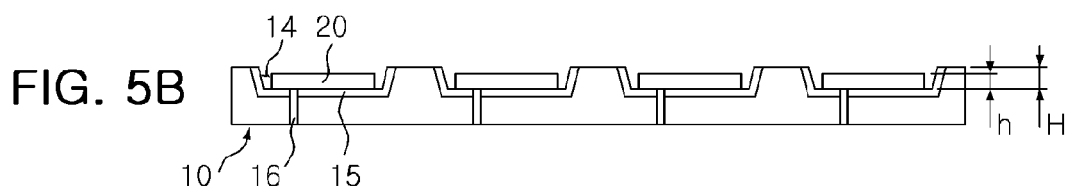

Thereafter, as illustrated in FIG. 5B, the light emitting device 20 is disposed or mounted within the recess 14. The light emitting device 20 may have a flip chip type structure in which electrodes are provided in the same direction. For example, the light emitting device 20 may have electrodes formed on a bottom surface thereof that faces a bottom surface of the recess 14, and the electrodes may be electrically connected to pads or conductors formed in the recess 14. The light emitting device 20 may be mounted within the recess 14 of the base 10 through solder bumps, or the like, so as to be electrically connected.

Figure 5C:
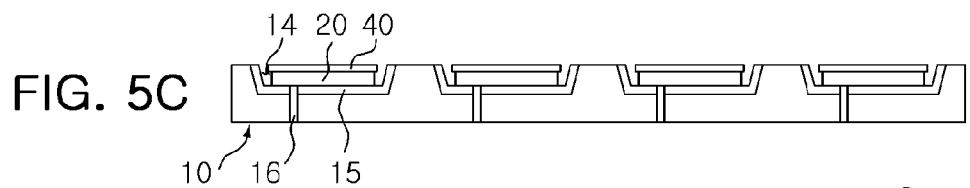

Thereafter, as illustrated in FIG. 5C, the wavelength conversion layer 40 is formed so as to be disposed on the light emitting device 20. The wavelength conversion layer 40 may be made of a transparent resin material such as silicon, epoxy, or the like, and may be formed as a film or a plate having a predetermined thickness. The wavelength conversion layer 40 may be disposed on an upper surface of the light emitting device 20. The wavelength conversion layer 40 may have a size larger than the light emitting device 20, such that the wavelength conversion layer 40 has an overhang structure that extends laterally outwards from outer edges of the upper surface of the light emitting device 20. The wavelength conversion layer 40 may be attached to the light emitting device 20 through an adhesive, or the like.

A resin material used to form the wavelength conversion layer 40 may contain at least one type of phosphor for converting a wavelength of light emitted from the light emitting device 20. Light emitted from the light emitting device 20 may be converted by the wavelength conversion layer 40 to provide white light. Also, the wavelength conversion material may be selected to emit light of another color (not necessarily white), such as green, red, or the like.

Figure 5D:
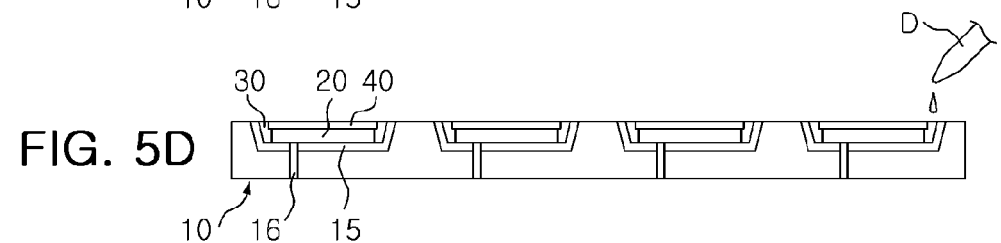

Thereafter, as illustrated in FIG. 5D, the reflective wall 30 is formed in the space between the light emitting device 20 and the recess 14, so as to surround the lateral surface of the light emitting device 20.

The reflective wall 30 may be made of a filler and white molding compounds having high light reflectivity, whereby light emitted from the lateral surface of the light emitting device 20 can be reflected by the reflective wall 30, thus increasing a quantity of light emitted by the light emitting device 20 that is emitted to the outside.

The filler may include one or more materials selected from the group consisting of $SiO_2$, $TiO_2$ and $Al_2O_3$. The filler may be contained as nano-scale particles in the white molding compounds. The white molding compounds may include a thermosetting resin having high heat resistance or a silicon resin. Also, the white molding compounds may include white pigment and a thermoplastic resin containing a filler, a hardening agent, a parting agent (or a mold release agent), an antioxidant, an adhesive strength improver, and the like, added thereto.

The reflective wall 30 may be formed by injecting white molding compounds containing the filler into the space between the light emitting device 20 and the recess 14 through the dispenser D and hardening the same.

Figure 5E:
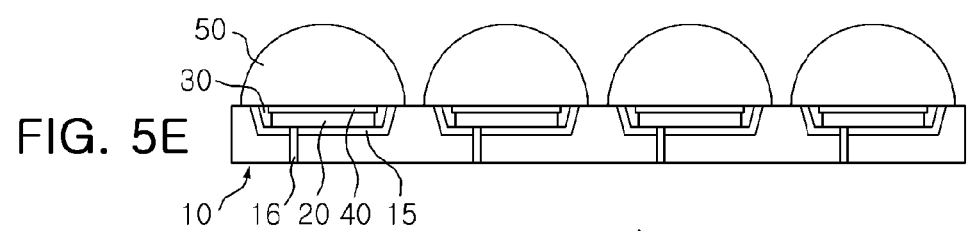

Thereafter, as illustrated in FIG. 5E, the lens 50 is formed on the base 10 to cover each light emitting device 20. The lens 50 may have a dome-like structure upwardly convex to improve an angle of beam spread of emitted light. The lens 50 may be directly formed on the base 10 through a molding method such as compression molding, transfer molding, or the like, or a potting method using a dispenser, or may be fabricated through a separate process and attached to the base 10 through an adhesive, or the like.

Figure 5F:
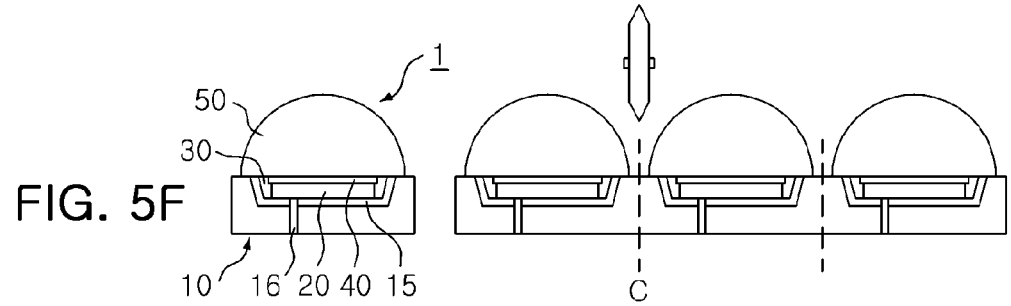

Thereafter, as illustrated in FIG. 5F, the base 10 is diced along a cutting line C to separate individual light emitting devices 1. In the present embodiment, it is illustrated that respective lenses 50 are formed on the base prior to the base 10 being separated into individual packages. More generally, however, the lenses 50 may be individually formed on the respective light emitting devices after the base 10 has been separated into individual packages. Also, the step of separating individual light emitting packages 1 may be omitted such that the plurality of light emitting devices 20 remain arranged on the base 10 and are used as a surface light source.

FIGS. 6A through 6G are cross-sectional views schematically illustrating a method of manufacturing a light emitting device package according to an exemplary embodiment.

Figure 6A:
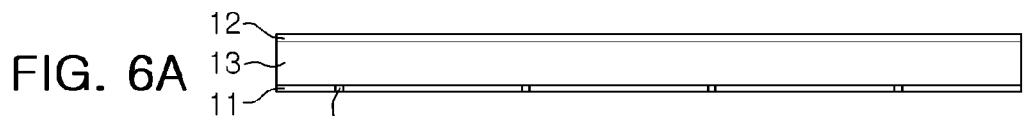
FIGS. 6A through 6G are cross-sectional views schematically illustrating a sequential process of manufacturing a light emitting device package according to another exemplary embodiment.

First, as shown in FIG. 6A, the base 10 made of a metal plate having conductivity is prepared. The metal plate may have a laminated structure including the first plate 11, the second plate 12, and the insulating layer 13 interposed between the first plate 11 and the second plate 12.

The first plate 11 and the second plate 12 may be made of the same metal or of different metals, and/or may be configured as thin films. The first and second plates 11 and 12 may be provided on opposite faces of the insulating layer 13. The insulating layer 13 may include a polyimide (PI) layer.

Figure 6B:
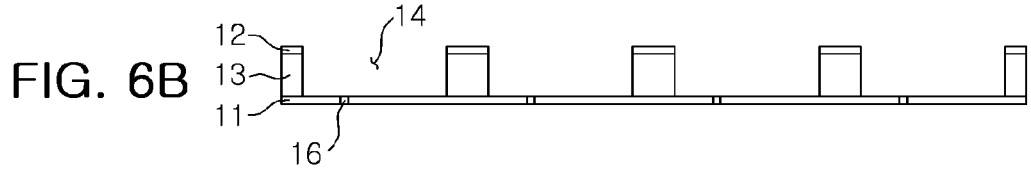

Thereafter, as shown in FIG. 6B, at least one recess 14 is formed on the base 10. The recess 14 in which the light emitting device 20 is mounted and disposed may be configured to penetrate the second plate 12 and the insulating layer 13, and a portion of the first plate 11 may be exposed to the recess 14. Thus, the first plate 11 forms the bottom of the recess 14, and the penetrated lateral portions of the insulating layer 13 and the second plate 12 may form lateral surfaces of the recess 14. The recess 14 may be formed to have a height ranging from 80% (i.e., −20%) to 120% (i.e., +20%) of the height h of the light emitting device 20.

Figure 6C:
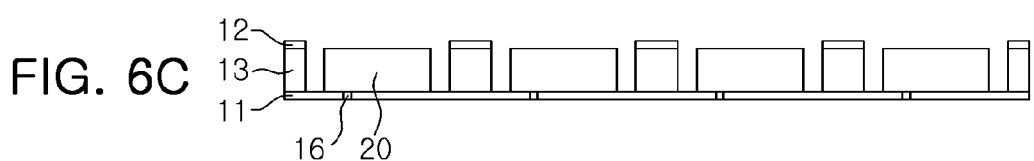

Thereafter, as illustrated in FIG. 6C, the light emitting device 20 is mounted to be disposed within the recess 14. The light emitting device 20 may have a flip chip type structure in which electrodes are provided in the same direction. For example, the light emitting device 20 may have electrodes formed on a bottom surface thereof that faces the base 10, and the electrodes may be electrically connected to pads or connectors formed in the base 10. The light emitting device 20 may be mounted on the exposed first plate 11 within the recess 14 of the base 10 through solder bumps, or the like, so as to be electrically connected.

Figure 6D:
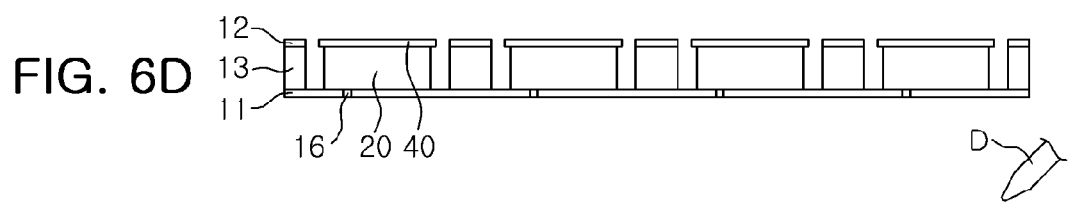

Thereafter, as illustrated in FIG. 6D, the wavelength conversion layer 40 is formed on an upper surface of the light emitting device 20. The wavelength conversion layer 40 may be made of a transparent resin material such as silicon, epoxy, or the like, and may be formed as a film or a plate having a predetermined thickness. The wavelength conversion layer 40 may have an overhang structure having a size larger than the light emitting device 20. The wavelength conversion layer 40 may be attached to the light emitting device 20 through an adhesive, or the like.

Figure 6E:
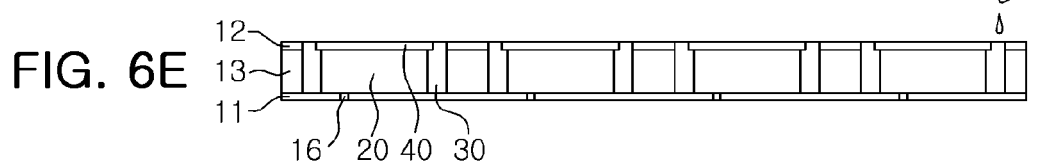

Thereafter, as illustrated in FIG. 6E, the reflective wall 30 is formed in the space between the light emitting device 20 and the recess 14 so as to surround the lateral surface of the light emitting device 20.

The reflective wall 30 may be made of a filler and white molding compounds having high light reflectivity. The reflective wall 30 may be formed by injecting white molding compounds containing the filler into the space between the light emitting device 20 and the recess 14 through the dispenser D and hardening the same.

Figure 6F:
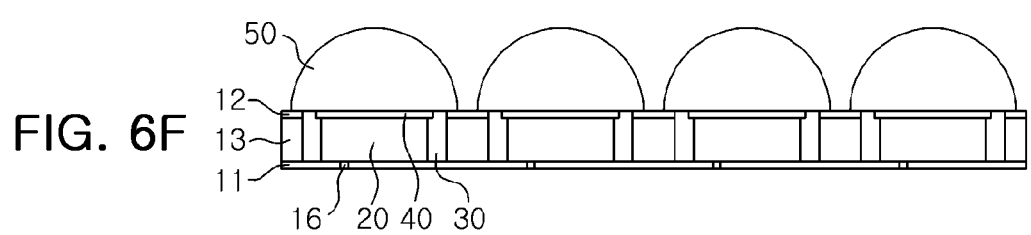

Thereafter, as illustrated in FIG. 6F, the lens 50 is formed on the base 10 to cover each light emitting device 20. The lens 50 may have a dome-like structure upwardly convex to improve an angle of beam spread of emitted light. The lens 50 may be directly formed on the base 10 through a molding method such as compression molding, transfer molding, or the like, or a potting method using a dispenser, or may be fabricated through a separate process and attached to the base 10 through an adhesive, or the like.

Figure 6G:
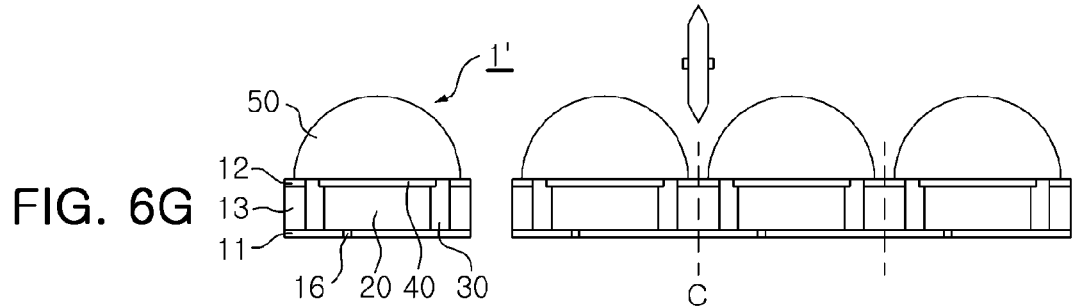

Thereafter, as illustrated in FIG. 6G, the base 10 is diced along a cutting line C to separate individual light emitting devices 1'. Also, without being separated into the individual light emitting packages 1', the plurality of light emitting devices 20 arranged on the base 10 may be used as a surface light source.

FIGS. 7A through 7F are cross-sectional views schematically illustrating a method of manufacturing a light emitting device package according to an exemplary embodiment.

Figure 7A:
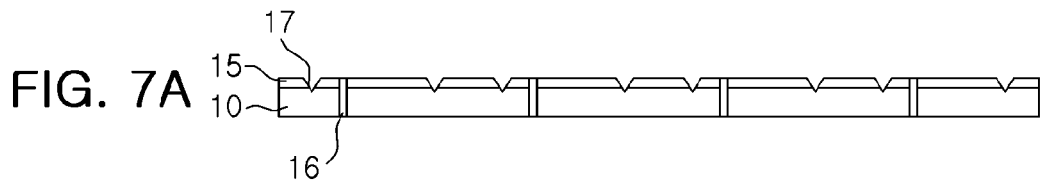
FIGS. 7A through 7F are cross-sectional views schematically illustrating a sequential process of manufacturing a light emitting device package according to another exemplary embodiment.

First, as illustrated in FIG. 7A, the base 10 is formed to have notches 17 formed thereon. The base 10 includes a metal plate having conductivity. The metal plate may include the notches 17 formed on the base 10, instead of the recess 14, defining a region in which the light emitting device 20 is mounted.

When the light emitting device 20 is mounted on the upper surface of the base 10, the notch 17 may be formed to be spaced apart from the light emitting device 20 and surround the light emitting device 20. Thus, the surface of the base 10 surrounded by the notch 17 may be defined as a mounting region on which the light emitting device 20 is mounted and disposed.

The notches 17 may be formed through press working, laser machining, etching, or the like, and may be arranged in a matrix form on the base 10.

The reflective layer 15 may be formed on the base 10. The reflective layer 15 may be made of a metal having high reflectivity and may be formed on the base 10 through coating, deposition, adhesion, or the like.

The notch 17 may be configured to be recessed at a predetermined depth from an upper surface of the base 10 to as to extend through the reflective layer 15. The illustrated structure corresponds to a case in which the reflective layer 15 is formed as a thin film. In cases in which the reflective layer 15 is thicker, the notch 17 may be formed in only the reflective layer 15 and may not reach the base 10.

Figure 7B:
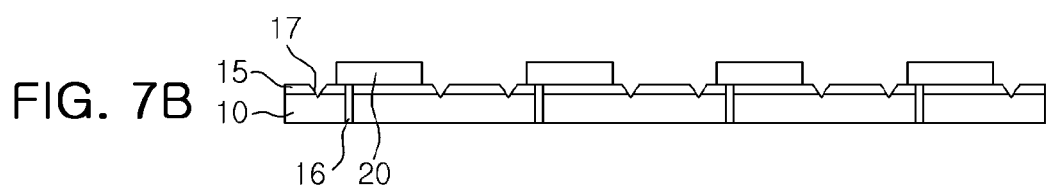

Thereafter, as illustrated in FIG. 7B, the light emitting device 20 is mounted on the base 10. The light emitting device 20 may be die-bonded on the mounting region defined by the notch 17. In the present embodiment, it is illustrated that a single light emitting device 20 is mounted in each mounting region, but the present disclosure is not limited thereto and, for example, a plurality of light emitting devices 20 may be mounted in each mounting region.

Figure 7C:
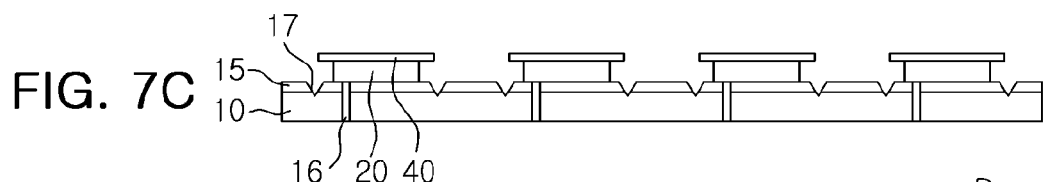

Thereafter, as illustrated in FIG. 7C, the wavelength conversion layer 40 is formed on the light emitting device 20. The wavelength conversion layer 40 may be made of a transparent resin material such as silicon, epoxy, or the like, and may be formed as a film or a plate having a predetermined thickness. The wavelength conversion layer 40 may have an overhang structure having a size larger than the light emitting device 20. The wavelength conversion layer 40 may be attached to the light emitting device 20 through an adhesive, or the like.

Figure 7D:
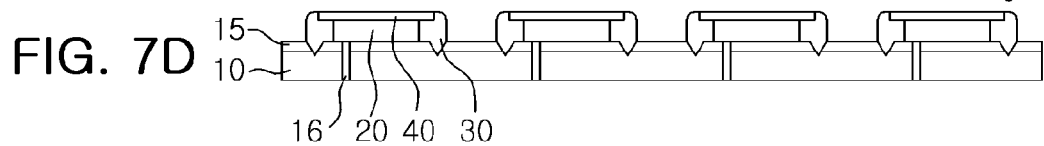

Thereafter, as illustrated in FIG. 7D, the reflective wall 30 surrounding the lateral surface of the light emitting device 20 is formed on the base 10. The reflective wall 30 may have a structure surrounding the lateral circumference of the light emitting device 20. The reflective wall 30 may be based on the notch 17, and use the notch 17 as an outer boundary on the base 10. In detail, the reflective wall 30 may only be formed within a region limited by the notch 17, and may be formed on side surfaces of the light emitting device 20 by using surface tension, rather than being widely spread on the upper surface of the base 10.

The reflective wall 30 may be made of a filler and white molding compounds having high light reflectivity, and may be formed by dispensing the white molding compounds containing the filler within the interior of the region defined by the notch 17. The reflective wall 30 may thus be formed along the lateral surface of the light emitting device 20 through the dispenser D, and may be formed by a hardening process.

Figure 7E:
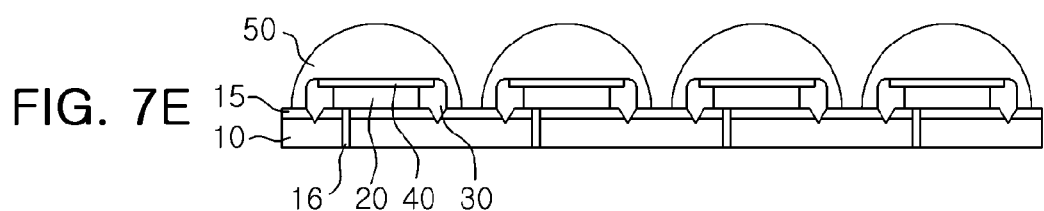

Thereafter, as illustrated in FIG. 7E, the lens 50 is formed on the base 10 to cover each light emitting device 20. The lens 50 may be configured to encapsulate the light emitting device 20 and the reflective wall 30 covering the lateral surface of the light emitting device 20.

The lens 50 may have a dome-like structure upwardly convex to improve an angle of beam spread of emitted light. The lens 50 may be directly formed on the base 10 through a molding method such as compression molding, transfer molding, or the like, or a potting method using a dispenser, or may be fabricated through a separate process and attached to the base 10 through an adhesive, or the like.

Figure 7F:
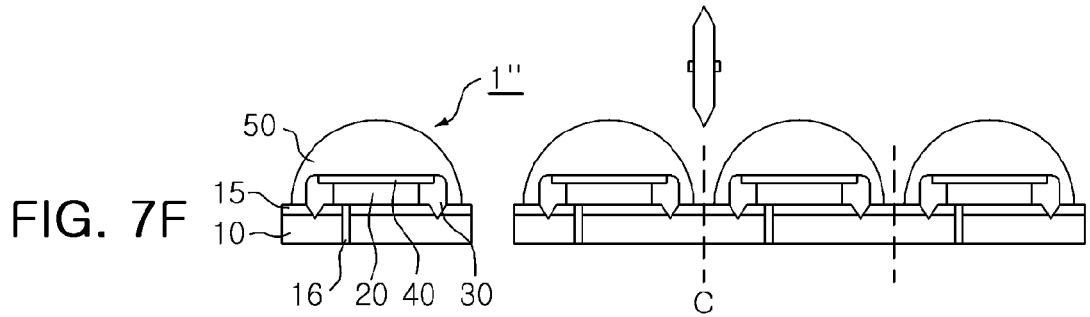

Thereafter, as illustrated in FIG. 7F, the base 10 is diced along a cutting line C to separate individual light emitting devices 1'. Also, without being separated into the individual light emitting packages 1', the plurality of light emitting devices 20 arranged on the base 10 may be used as a surface light source.

As set forth above, according to exemplary embodiments, a light emitting device package is provided in which light generated from the side of the light emitting device can be easily controlled, and a method of manufacturing the same is also provided.

Various advantages and effects of exemplary embodiments are not limited to the foregoing content and may be easily understood through the process explaining the specific exemplary embodiments.

While exemplary embodiments have been shown and described above, it will be apparent to those skilled in the art that modifications and variations can be made without departing from the spirit and scope of the inventive concepts as defined by the appended claims.

What is claimed is:

1. A light emitting device package comprising:
   a base including at least one recess;
   at least one light emitting device disposed within the recess;
   a wavelength conversion layer disposed on the light emitting device; and
   a reflective wall filling a space between the light emitting device and the recess so as to contact and surround lateral surfaces of the light emitting device,
   wherein the recess is formed to have a depth ranging from 80% to 120% of a height of the light emitting device.

2. The light emitting device package of claim 1, wherein the wavelength conversion layer is larger than the light emitting device and extends laterally outwards from edges of the light emitting device.

3. The light emitting device package of claim 1, wherein the wavelength conversion layer is disposed such that an upper surface of the wavelength conversion layer does not contact the reflective wall.

4. The light emitting device package of claim 1, wherein the base includes a metal plate having conductivity.

5. The light emitting device package of claim 4, further comprising:
   a reflective layer covering a surface of the recess and formed by depressing an upper surface of the metal plate.

6. The light emitting device package of claim 4, wherein the metal plate includes a first plate, a second plate, and an insulating layer interposed between the first plate and the second plate, and
   wherein a portion of an upper surface of the first plate is exposed to the recess, and the recess penetrates through the second plate and the insulating layer.

7. The light emitting device package of claim 1, wherein the reflective wall comprises a filler and white molding compounds.

8. The light emitting device package of claim 1, further comprising:
   a lens installed on the base and covering the light emitting device.

9. The light emitting device package of claim 1, wherein the reflective wall fills the space between the light emitting device and the recess to as to cover the lateral surfaces of the light emitting device.

10. The light emitting device package of claim 9, wherein the reflective wall contacts and covers the entirety of the lateral surfaces of the light emitting device.

11. The light emitting device package of claim 1, wherein the reflective wall contacts and covers the entirety of the lateral surfaces of the light emitting device and of the wavelength conversion layer.

12. The light emitting device package of claim 1, wherein the depth of the recess is lower than the height of the light emitting device, and the reflective wall contacts portions of lateral surfaces of the light emitting device that extend upwards above the recess.

13. The light emitting device package of claim 7, wherein the filler of the reflective wall comprises one or more materials selected from the group consisting of $SiO_2$, $TiO_2$ and $Al_2O_3$.

14. The light emitting device package of claim 7, wherein the filler comprises nano-scale particles in the white molding compounds.

15. The light emitting device package of claim 7, wherein the white molding compounds comprise a thermosetting resin.

* * * * *